United States Patent
Bhattacharyya

(10) Patent No.: US 10,276,576 B2
(45) Date of Patent: Apr. 30, 2019

(54) GATED DIODE MEMORY CELLS

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/641,828

(22) Filed: Jul. 5, 2017

(65) Prior Publication Data
US 2019/0013316 A1  Jan. 10, 2019

(51) Int. Cl.
H01L 27/102 (2006.01)
G11C 16/10 (2006.01)
H01L 29/51 (2006.01)
H01L 29/739 (2006.01)
H01L 23/538 (2006.01)
H01L 27/11568 (2017.01)
H01L 29/66 (2006.01)
H01L 29/423 (2006.01)
H01L 21/02 (2006.01)
H01L 21/28 (2006.01)
H01L 27/07 (2006.01)

(52) U.S. Cl.
CPC .......... *H01L 27/1026* (2013.01); *G11C 16/10* (2013.01); *H01L 21/02112* (2013.01); *H01L 21/02192* (2013.01); *H01L 21/28282* (2013.01); *H01L 23/538* (2013.01); *H01L 27/0711* (2013.01); *H01L 27/11568* (2013.01); *H01L 29/42312* (2013.01); *H01L 29/511* (2013.01); *H01L 29/517* (2013.01); *H01L 29/518* (2013.01); *H01L 29/66356* (2013.01); *H01L 29/7391* (2013.01)

(58) Field of Classification Search
CPC .......... H01L 27/1026; H01L 21/02112; H01L 21/02192; H01L 21/28282; H01L 23/538; H01L 27/0711; H01L 27/11568; H01L 29/42312; G11C 16/10
See application file for complete search history.

(56) References Cited

U.S. PATENT DOCUMENTS

| 4,870,470 | A  | 9/1989 | Bass et al. |
| 6,743,681 | B2 | 6/2004 | Bhattacharyya |
| 6,743,682 | B2 | 6/2004 | Woerlee et al. |
| 6,888,200 | B2 | 5/2005 | Bhattacharyya |
| 6,903,969 | B2 | 6/2005 | Bhattacharyya |

(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.

(Continued)

*Primary Examiner* — Tri M Hoang
(74) *Attorney, Agent, or Firm* — Brooks, Cameron & Huebsch, PLLC

(57) ABSTRACT

Examples relate generally to the field of semiconductor memory devices. In an example, a memory cell may include an access device coupled to an access line and a gated diode coupled to the access device. The gated diode may include a gate stack structure that includes a direct tunneling material, a trapping material, and a blocking material.

18 Claims, 5 Drawing Sheets

(56) References Cited

U.S. PATENT DOCUMENTS

| | | | |
|---|---|---|---|
| 6,917,078 B2 | 7/2005 | Bhattacharyya | |
| 6,998,667 B2 | 2/2006 | Bhattacharyya | |
| 7,012,297 B2 | 3/2006 | Bhattacharyya | |
| 7,042,027 B2* | 5/2006 | Bhattacharyya | G11C 11/39 257/107 |
| 7,130,216 B2 | 10/2006 | Bhattacharyya | |
| 7,145,186 B2 | 12/2006 | Bhattacharyya | |
| 7,158,410 B2 | 1/2007 | Bhattacharyya et al. | |
| 7,166,888 B2 | 1/2007 | Bhattacharyya | |
| 7,184,312 B2 | 2/2007 | Bhattacharyya | |
| 7,208,793 B2 | 4/2007 | Bhattacharyya | |
| 7,224,002 B2 | 5/2007 | Bhattacharyya | |
| 7,244,981 B2 | 7/2007 | Bhattacharyya | |
| 7,250,628 B2 | 7/2007 | Bhattacharyya | |
| 7,273,784 B2 | 9/2007 | Bhattacharyya | |
| 7,276,760 B2 | 10/2007 | Bhattacharyya | |
| 7,279,740 B2 | 10/2007 | Bhattacharyya et al. | |
| 7,339,239 B2 | 3/2008 | Forbes | |
| 7,339,830 B2 | 3/2008 | Bhattacharyya | |
| 7,349,252 B2 | 3/2008 | Bhattacharyya et al. | |
| 7,365,388 B2 | 4/2008 | Bhattacharyya | |
| 7,379,336 B2 | 5/2008 | Bhattacharyya et al. | |
| 7,385,245 B2 | 6/2008 | Bhattacharyya | |
| 7,400,012 B2 | 7/2008 | Bhattacharyya | |
| 7,403,416 B2 | 7/2008 | Bhattacharyya et al. | |
| 7,417,893 B2 | 8/2008 | Bhattacharyya et al. | |
| 7,429,767 B2 | 9/2008 | Bhattacharyya | |
| 7,432,562 B2 | 10/2008 | Bhattacharyya | |
| 7,436,018 B2 | 10/2008 | Bhattacharyya | |
| 7,440,310 B2 | 10/2008 | Bhattacharyya | |
| 7,440,317 B2 | 10/2008 | Bhattacharyya | |
| 7,456,054 B2 | 11/2008 | Bhattacharyya | |
| 7,457,159 B2 | 11/2008 | Bhattacharyya et al. | |
| 7,459,740 B2 | 12/2008 | Bhattacharyya et al. | |
| 7,476,927 B2 | 1/2009 | Bhattacharyya | |
| 7,482,651 B2 | 1/2009 | Bhattacharyya | |
| 7,485,513 B2 | 2/2009 | Bhattacharyya | |
| 7,525,149 B2 | 4/2009 | Bhattacharyya et al. | |
| 7,528,043 B2 | 5/2009 | Bhattacharyya | |
| 7,544,990 B2 | 6/2009 | Bhattacharyya | |
| 7,553,735 B2 | 6/2009 | Bhattacharyya | |
| 7,579,242 B2 | 8/2009 | Bhattacharyya | |
| 7,612,403 B2 | 11/2009 | Bhattacharyya | |
| 7,625,803 B2 | 12/2009 | Bhattacharyya | |
| 7,629,641 B2* | 12/2009 | Bhattacharyya | B82Y 10/00 257/317 |
| 7,662,693 B2 | 2/2010 | Bhattacharyya | |
| 7,671,407 B2 | 3/2010 | Bhattacharyya | |
| 7,728,350 B2 | 6/2010 | Bhattacharyya | |
| 7,749,848 B2 | 7/2010 | Bhattacharyya et al. | |
| 7,750,395 B2 | 7/2010 | Bhattacharyya | |
| 7,759,715 B2 | 7/2010 | Bhattacharyya | |
| 7,768,062 B2 | 8/2010 | Bhattacharyya et al. | |
| 7,786,516 B2 | 8/2010 | Bhattacharyya | |
| 7,838,362 B2 | 11/2010 | Bhattacharyya | |
| 7,851,827 B2 | 12/2010 | Bhattacharyya | |
| 7,867,850 B2 | 1/2011 | Bhattacharyya | |
| 7,898,022 B2 | 3/2011 | Bhattacharyya | |
| 7,956,426 B2 | 6/2011 | Bhattacharyya | |
| 7,964,909 B2 | 6/2011 | Bhattacharyya | |
| 7,968,402 B2 | 6/2011 | Bhattacharyya | |
| 8,058,118 B2 | 11/2011 | Bhattacharyya | |
| 8,063,436 B2 | 11/2011 | Bhattacharyya | |
| 8,125,003 B2* | 2/2012 | Bhattacharyya | G11C 11/40 257/154 |
| 8,129,243 B2* | 3/2012 | Bhattacharyya | B82Y 10/00 257/E27.078 |
| 8,143,657 B2 | 3/2012 | Bhattacharyya | |
| 8,159,875 B2 | 4/2012 | Bhattacharyya | |
| 8,193,568 B2 | 6/2012 | Bhattacharyya | |
| 8,228,743 B2 | 7/2012 | Min et al. | |
| 8,242,554 B2 | 8/2012 | Bhattacharyya | |
| 2007/0034922 A1 | 2/2007 | Bhattacharyya | |
| 2008/0303080 A1 | 12/2008 | Bhattacharyya | |
| 2008/0305597 A1* | 12/2008 | Kitano | H01L 21/28229 438/287 |
| 2010/0090265 A1 | 4/2010 | Bhattacharyya et al. | |
| 2014/0246736 A1* | 9/2014 | Chang | H01L 29/401 257/411 |
| 2015/0115348 A1* | 4/2015 | Nam | H01L 27/11582 257/324 |

OTHER PUBLICATIONS

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of HF-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE

(56) References Cited

OTHER PUBLICATIONS

International Electron Devices Meeting (IEDM) 2000, Dec. 10-13, 2000, San Francisco, CA, pp. 545-648.
Lue et al., "A Novel P-Channel NAND-type Flash Memory with 2 bit/cell Operation and High Programming Throughput (> 20 Mb/sec)", IEEE International Electron Devices Meeting (IEDM) 2005, Dec. 5-7, 2005, Washington, D.C., 4 pages.
Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.
Luo et al., "Design of High Performance PFETs with Strained Si Channel and Laser Anneal", IEEE International Electron Devices Meeting (IEDM) 2005, Dec. 5-7, 2005, Washington D.C., pp. 495-498.
Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.
Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.
Mayuzumi et al., "Extreme High Performance n- and p- MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.
Moon et al., "Multi-Functional Universal Device using a Band-Engineered Vertical Structure", IEEE International Electron Devices Meeting (IEDM) 2011, Dec. 5-7, 2011, Washington D.C., pp. 551-554.
Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.
Oh et al., "4-bit Double Sonos Memories (DSMs) Using Single-Level and Multi-Level Cell Schemes", IEEE International Electron Devices Meeting (IEDM) 2006, Dec. 11-13, 2006, San Francisco, CA, pp. 967-970.
Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.
Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.
Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.
Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.
Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.
Taguchi, "NOR Flash Memory Technology", presented at 2006 IEEE International Electron Devices Meeting (IEDM) Short Course on Memory Technologies for 45nm and Beyond, Dec. 2006, 27 pages.
Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.
Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.
Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.
Zhang et al., Novel ZrO2/Si3N4 Dual Charge Storage Layer to Form Step-up Potential Wells for Highly Reliable Multi-level Cell Application, IEEE International Electron Devices Meeting (IEDM) 2007, Dec. 10-12, 2005, Washington D.C., pp. 83-86.
Likharev, "Riding the Crest of a New Wave in Memory", IEEE Circuits and Devices Magazine, vol. 16, Issue 4, Jul. 2000, pp. 16-21.
Ramaswamy et al., "Engineering a Planar NAND Cell Scalable to 20nm and Beyond", 2013 5th IEEE Memory Workshop, May 26-29, 2013, Monterey, CA, pp. 5-8.
Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

\* cited by examiner

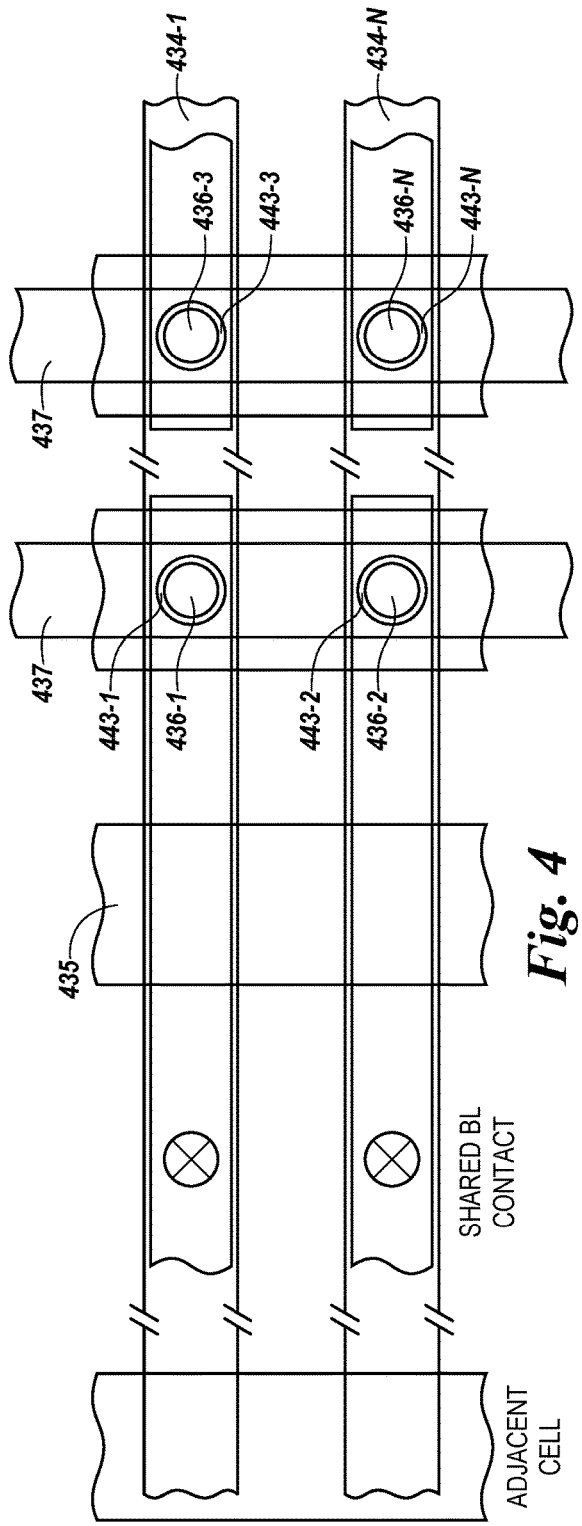
Fig. 4
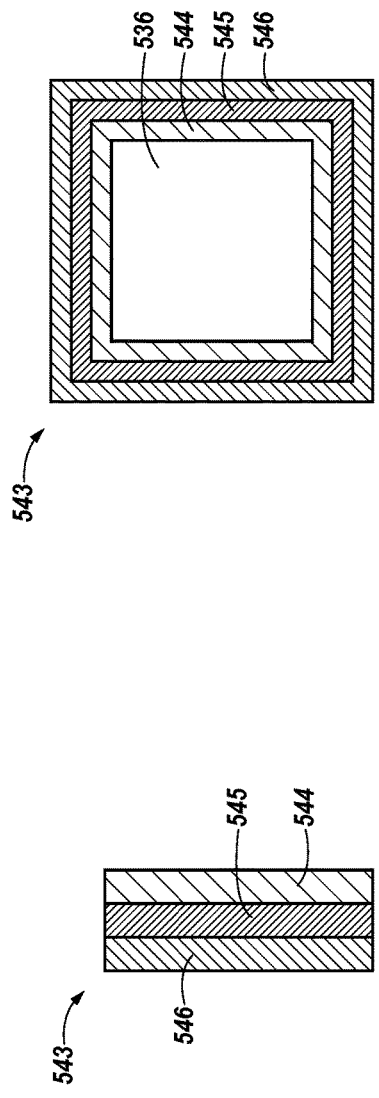
Fig. 5B
Fig. 5A

GATED DIODE MEMORY CELLS

TECHNICAL FIELD

The present disclosure relates generally to memory cells, and, more particularly, to gated diode memory cells.

BACKGROUND

Memory is sometimes implemented in electronic systems, such as computers, cell phones, hand-held devices, etc. There are many different types of memory, including volatile and non-volatile memory. Volatile memory may require power to maintain its data and may include random access memory (RAM), dynamic random-access memory (DRAM), static random access memory (SRAM), and synchronous dynamic random access memory (SDRAM). Non-volatile memory may provide persistent data by retaining stored data when not powered and may include NAND flash memory, NOR flash memory, nitride read only memory (NROM), phase-change memory (e.g., phase-change random access memory), resistive memory (e.g., resistive random-access memory), or the like. Hard disc drives (HDDs) may be an example of another type of memory and may include magnetic tapes and/or optical discs.

Some electronic systems may include a processor (e.g., for controlling the electronic system). For example, some processors may include SRAM. In some examples, a processor may include a cache memory that may be an SRAM or a DRAM. The processor may be coupled to a working memory that may be a DRAM, in some examples.

The processor may be coupled to data storage devices, such as solid-state-data-storage devices (e.g., sometimes called solid-state drives (SSDs)) and/or hard disc drives. For example, a solid-state-data-storage device might include NAND flash memory, NOR flash memory, and/or NROM.

BRIEF DESCRIPTION OF THE DRAWINGS

FIG. 4 illustrates an example of a memory device in accordance with the present disclosure.

FIG. 5A illustrates a side view of a portion of a gate stack structure in accordance with the present disclosure.

FIG. 5B illustrates a top view of a portion of a gate stack structure in accordance with the present disclosure.

DETAILED DESCRIPTION

Figure 1:
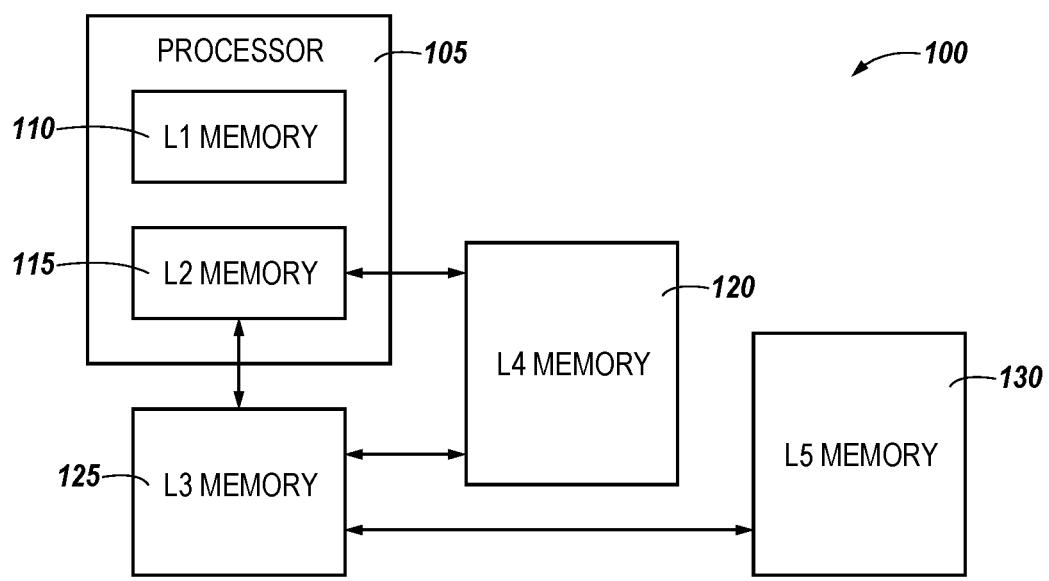
FIG. 1 is a block diagram that illustrates an example of an apparatus in the form of an electronic system in accordance with the present disclosure.

In an example, a memory cell may include an access device coupled to an access line and a "gate-controlled" diode coupled to the access device. The gated-controlled diode or gated diode may include a gate stack structure that includes a direct tunneling material, a trapping material, and a blocking material. The gate stack structure controls the turn-off characteristics of the memory cell, thereby controlling the cycle time and programming performance of the memory cell which may range from fractions of millisecond to less than 1 ns. By controlling the gate stack design and related programming parameters, the memory cell cycle time could be varied by many orders of magnitude and applicability could be tailored.

In some approaches, a p-i-n or n-i-p diode-based non-volatile memory (NVM) may include a gate-triggered or gate controlled element to remove the stored charge left in the intrinsic region of the diode during the turn-on state of the diode. The gating action controls the electrical behavior of the NVM specifically, the turn-off characteristics of the non-volatile binary state of memory from the "on" (or "1") state to the "off" (or "0") state of the memory. This impacts the cycle time of the non-volatile memory. By varying the gating action or the gate-stack charging time, the turn-off speed of the memory cell could be altered and thereby, the cycle time of the memory cell could be varied. This enables the memory cell applicability to range from L1 to L3 depending on system application requirements.

Some NVM approaches may include a gated-thyristors operating as bi-stable switching devices. For example, a trenched-gated-thyristor may be included in some approaches to NVMs to facilitate switching operations in the NVM.

In contrast, embodiments herein include NVMs that include a gated diode. In some embodiments, the gated diode may be a P-i-N (e.g., a $P^+$-i-$N^+$) type diode or a N-i-P (e.g., a $N^+$-i-$P^+$) type diode. As described herein, such a NVM may utilize non-linear I-V characteristics of the diode to achieve stable non-volatile states via an integrated gate stack structure coupled with the intrinsic region of the diode to modulate the turn-off characteristics of the diode from the stable on state of "1" to the stable off state of "0" thereby controlling the programming performance of the non-volatile memory cell. The gate stack structure design and the gating operation may include a plurality of different materials and programming timing respectively, which could be varied to achieve a wide range of memory cycle time (and related memory throughput), as described in more detail herein.

In some embodiments, use of the gate-controlled diode and/or gate stack structure described herein may allow for a memory cell having a faster operating speed at reduced power consumption as compared to conventional FET-based NVMs or even a thyristor-based NVM approaches. A specific advantage compared to FET-based NVMs is that the diode operates at power supply potential and the gating stack structure could be made operable at the power supply potential not requiring potential-boosting circuitry for programming as required for FET-based NVM devices. The embodiments described herein, therefore, may be fully compatible with scaled complementary metal-oxide-semiconductor technology. Additionally, memory cell fabrication may be simpler and denser due to the use of a three terminal diode as opposed to a four terminal thyristor, and may be easier to integrate and/or fabricate than FET-based NVMs and thyristor-based NVMs.

A number of embodiments of the present disclosure provide benefits, such as higher programming speed, reduced programming voltages, higher data retention, increased endurance, and reduced energy consumption, as compared to various prior approaches.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a block diagram that illustrates an example of an apparatus in the form of an electronic system 100. System 100 can be, for example, a digital system, a computer system, a memory system, a hand-held device, a cell phone, etc. FIG. 1 illustrates an example of a memory hierarchy associated with electronic system 100. In this example, the memory hierarchy may include levels L1 to L5. As an example, levels L1 to L5 may be defined by memory characteristics (e.g., access speed, memory cell size, reliability, endurance, volatility, memory-window size, etc.). For example, in going from level L1 to level L5, the access speed and volatility of the memory progressively decrease, while the capacity of the memory increases.

Note that the data access speed, for example, may be related to the read access time of the memory that implies the time it takes to ensure the binary ("1" or "0") state of any particular memory bit within a memory array (e.g., the higher the access speed, the lower the access time). For example, the cycle time may imply the time it takes to not only establish the binary memory state of any storage bit (either 1, or 0) through programming ("write" and or "erase") of the specific bit within the memory array, but also the time to ensure the memory state which is the access time. Memory delay (e.g., memory latency) may imply the time it takes for the memory bit to arrive at the processor node once the processor fetches the memory bit triggered by a unit of a clock cycle of the processor, for example. Memory bandwidth (e.g., memory throughput), for example, may be related and inversely proportional to the memory latency. The higher the memory bandwidth, for example, the lower the delay and lower the memory cycle time. For example, the data throughput may be inversely related to the data cycle time combined with the data transfer time to the processor, where the data transfer time to the processor may be dependent on the design of the memory output system and the transfer mode. Therefore, when memory with lower latency (e.g., a lower cycle time) may be employed, for example, the processor may execute an assigned task (e.g. any specific function or program) faster and the performance of a system (e.g., digital system) may be improved.

Memory volatility may be related to two aspects of retention of the memory state of any memory bit. One aspect of retention may be the retention of a memory state when the power is available to the memory array, implying that no re-writing (e.g., refreshing), such as re-establishing, the memory state is required during a time period. This aspect of retention may be longer for SRAM and shorter (in the order of milliseconds) for DRAM. Therefore, DRAM may require frequent refreshing of a memory state even when the power is on for the memory array. The other aspect of memory retention, for example, may be the ability to retain a written (e.g., established) memory state of any bit when there is no power to the memory array. Memory state retention of this type might be about 10 years for some nonvolatile memories of some SSDs (NROMs or NAND types of memory cells) and HDDs (magnetic tapes or disks).

When power is not available, for example, the memory states of SRAMs and DRAMs may be lost. Therefore, these types of memories may be classified as volatile memories. For non-volatile memories, for example, the lower the degree of volatility, the longer the memory retains data, and thus the greater the retention. For example, SDDs may, in general, be less nonvolatile compared to HDDs, where HDDs could retain data for centuries in properly stored environment. Silicon-based non-volatile memories may vary significantly in memory retention, depending on the memory type (NROM or NAND Flash), the memory cell attributes, and the detailed stack structure of the memory cell design. Some memory cell designs of NROMs and NAND, for example, may have at least one year of nonvolatility for most of the applications for which such memories are employed.

Another important property of memory, for example, may be the number of times memory binary states may be "written" or altered or "programmed" during the life time of the electronic system. In some examples, systems, such as memory systems, may be assumed to last for about 10 years, during which some memory bits may be altered for as many as thousand trillion times (1E15 times). The SRAMs and DRAMs, might, for example, withstand such re-programming known as "endurance." Endurance limits of some NROMs, for example, may be about 10 million times, while those of some NAND flash memories may be about 100,000 times to about one million times. This may limit the application of current NROMs and NANDs for L1, L2, and L3 memory applications, besides their significantly slower cycle time compared to SRAMs and DRAMs.

Electronic system 100 may include a processor 105, such as a microprocessor, that may control electronic system 100. Processor 105 may include a memory 110, such as a logic memory, having a memory level L1. For example, a conventional L1-level memory may be an SRAM volatile memory or SRAM non-volatile memory. Processor 105 may also include a memory 115, such as a cache memory, that may have a memory level L2, for example. An example of a conventional L2-level memory may be an SRAM volatile cache memory.

Advantages of SRAM may include, for example, high performance (e.g., high data throughput), L1/L2-level functionality, and ease of fabrication (e.g., that may be compatible with complementary-metal-oxide-semiconductor (CMOS) fabrication techniques). Disadvantages of SRAM may include, for example, relatively large power requirements, and limiting memory capacity dude, for example, to relatively large memory cell sizes (e.g., with a form factor FxF of about 50 to about 80) and volatility.

Memory 115 may be coupled to a memory 120, as shown in FIG. 1. Memory 115 may also be coupled to a memory 125, and memory 125 may be coupled to memory 120, for example. The term couple may include connect. For example, coupled to may include electrically connected to and/or physically connected to, such as by direct or indirect contact.

Memory 125 may be a main memory (e.g., a working memory) and may have a memory level L3. An example of a conventional L3-level memory may be DRAM volatile memory. Advantages of DRAM, for example, may include relatively higher performance compared to NVMs (e.g., read, write, and erase times of less than about 10 nanoseconds), relatively small (e.g., an F×F of about 6 to about 8) one-transistor-one-capacitor memory cells yielding higher capacity, and relatively higher performance with lower cycle time to provide and L3-level functionality. Disadvantages of DRAM may include, for example, fabrication (e.g., customized CMOS fabrication for the capacitor may be required), scalability (e.g., may be difficult to scale to below 30 nanometers), and volatile memory cells (e.g., data may need to be refreshed about every millisecond).

Memory 120 may be a storage memory (e.g., for storing data and/or code) and may have a memory level L4. Examples of L4-level memory may include non-volatile NOR memory, non-volatile NAND memory, and non-volatile NROM. In some examples, memory 120 may be referred to as a solid-state memory.

Advantages of NROM (e.g., NROM flash) may include, for example, relatively high read performance (e.g., fast reads), non-volatile memory cells, relatively small (e.g., an F×F of about 6), random-access-one-transistor memory cells, multiple-bit-per cell storage capability, basic-input/output-system (BIOS) functionality, code storage capability, and fabrication (e.g., compatible with CMOS fabrication techniques). Disadvantages of NROM may include, for example, relatively slow writes, relatively high programming voltages, relatively low read/write endurance, and relatively poor durability.

Advantages of NAND (e.g., NAND flash) may include, for example, small (e.g., an F×F of about 4) one-transistor memory cells with single-bit- and multiple-bit-per cell storage capability, non-volatile memory cells, and high storage capacity per mm$^2$ of silicon. Disadvantages of NAND may include, for example, relatively slow write speeds (e.g., about 0.1 to about 1 millisecond), relatively slow access (e.g., serial/parallel memory access), and relatively low write/erase (W/E) endurance (e.g., about $10^3$ to about $10^5$ W/E cycles).

Memory 125 may be coupled a memory 130, having a memory level L5, for example. Examples of conventional L5-level memories may include magnetic memory (e.g., magnetic tapes) and/or optical memory (e.g., optical discs) for storing data. In some examples, memory 130 may be referred to as an HDD memory. Advantages of magnetic memory may include, for example, non-volatility, high-density storage, low cost, high capacity, and L5-level functionality. Disadvantages of magnetic memory may include, for example, speed (e.g., long access and cycle times), relatively poor reliability, and moving mechanical parts.

A memory hierarchy, such as that described above, may advantageously employ, for example, the memories described above, such as the L1- to L5-level memories (e.g., SRAM, DRAM, NROM, NAND, and HDD) to fulfill system functionality objectives with cost, capability, power, performance, form-factor, portability, and applications in mind. The hierarchy may require communication between various memories and, therefore, for example, may disadvantageously involve a significant amount of peripheral logic, power, cost, performance compromises, form-factor constraints, reliability issues, and durability issues. This, for example, may suggest a "one-type-fits-all" approach to memory design (e.g., a novel one-type-fits-all memory). Except for HDD, some processors and memories may be silicon based and may be built using scaled CMOS field-effect transistor technology, for example.

There may be a need for memories that might include silicon-based-non-volatile-one-transistor memory cells that may satisfy the speed, power, and/or capacity requirements of L1-, L2-, L3-, L4-, and L5-level memories. For example, there may be a need for one type of memory cell that may satisfy the speed, power, and/or capacity requirements of L1-, L2-, L3-, L4-, and L5-level memories. There may be a need, for example, for unified technology integration with CMOS logic, such as unified fabrication techniques (e.g., that may be compatible with CMOS fabrication techniques). There may be a need, for example, for scalable and lower-power memories (e.g., memory cells) with higher reliability and durability. There may be a need, for example, to do away with the conventional memory hierarchy (e.g., in favor of a non-hierarchical organization) that may result in faster communication with the processor.

Conventional memory requirements and selection, in general, may be based on application, capacity, and power requirements, cost, portability, form factor, and system performance/execution requirements. Some memory parameters, for example, may be cost, form factor, package density, and power consumption. Another parameter in selecting specific memory types and organizing memory use in a specific system, such as electronic system 100, may be data throughput, such as cycle time. For example, data throughput may depend on the intrinsic characteristics of the memory cell.

Cycle time, as mentioned earlier, may strongly impact the time it takes for the processor to fetch a specific bit of data from a specific memory array. Examples of estimated cycle times may include, for example, about 0.5 nanosecond to about 1.0 nanosecond for SRAM, about 5.0 nanoseconds to about 20 nanoseconds for DRAM, about 500 nanoseconds to about about 500 nanoseconds to about 100000 nanoseconds for NROM, and greater than about million nanoseconds for NAND.

The present disclosure includes memory comprising non-volatile memory cells in which an active element comprising a part of the memory cell, such as a P-i-N or a N-i-P diode, may be integrated with a gated stack over the intrinsic region of the diode where the gate controlling dielectric stack that can store a charge and modulate the gating action speed thereby modulating the turn-off time for the memory cell. In some examples, such a memory might be referred to as silicon-based-unified memory (SUM), such as uni-functional SUM (USUM). In some examples, the design of the dielectric stack may be varied so that the non-volatile memory cell (e.g., a USUM memory cell) may preferably operate as an L1-, L2-, L3-level memory cell. For example, the memory cells disclosed herein may have higher performance, lower power consumption, and higher reliability than, for example, some conventional NVM cells.

In some examples, the gate-controlled diode-based non-volatile memory device is a part of a family of USUM devices. The USUM devices may be designed to achieve different functionality, dependent on intrinsic dielectric stack characteristics of the gate-controlled memory cell by design, by adding or subtracting dielectrics in the dielectric stack to alter the charging time of the gate-triggering aspect of the memory cell to modulate the cycle time of the memory and thereby memory throughput and functionality. USUM technology may be readily integrated with the CMOS logic technology, for example, unlike conventional memories, such as DRAM, that may have unique customized integration requirements. USUMs may be differentiated by the attributes of their stack design and operational characteristics. For example, the intrinsic memory-cell attributes may be different in terms of programming speed, power, and refresh requirements that may result in cycle-time variations and differing applicability to replace conventional memories by functionality.

In some examples, some USUMs may have a programming voltage of about 1.5 volts (e.g., compared to about 12 volts for some NROMs and NANDs) and a programming speed in the order of a nano sec which if needed could be extended to as long as 1 ms, for example.

In various examples, SUM-memory-cell fabrication is compatible with complementary-metal-oxide-semiconductor (CMOS) fabrication techniques. This may allow, for example, the dielectric stack to be fabricated to a desired memory level (L1, L2, L3, L4, or L5) with a minimal number of additional processing steps. Moreover, the SUM memory cells may be scalable to about a five-nanometer feature size. For example, such scaling may be difficult for conventional SRAM and DRAM designs.

USUM memory cells may be implemented (e.g., in scaled silicon) using, for example, CMOS logic technology and a set of unified and complimentary integration schemes that may eliminate some separate, custom-integration technology practices, such as those currently employed for DRAM (e.g., for L3), NROM (for code, BIOS, etc.), and NAND-Flash (e.g., for L4) memory chips today. USUM memory cell technology may only add or subtract specific selected dielectric thin film layer or layers in the gate stack design in a unified process integration methodology with the scaled CMOS logic technology to enable functionality equivalence from L1 through L5. This would potentially have multiple benefits such as a) technology compatibility, b) productivity, c) enhancement in technology reliability, and d) elimination of interfacing technology and packaging between different memory types and between logic and memories. Consequently, potential benefit in system level may include not only process complexity reduction, but also, cost reduction, power reduction, and enhancements in performance, and reliability.

Multiple and wide-ranging memory cell performance and associated data throughput from the memory array may be built into the same USUM cell design. For example, this may be achieved by integrating dielectrics with well-defined intrinsic attributes into the dielectric stack design of a USUM memory cell while using a similar (e.g., the same) technology integration scheme. This may provide, for example, certain functionality and memory capability within a single memory array design that may not be feasible for conventional memories.

USUMs, for example, may allow for similar memory cell designs and array architectures across the memory hierarchy that may provide a spectrum of cycle time, latency targets, and data throughput to deliver varying functionality requirements that might be balanced for certain applications. Due to the process commonality, USUM-cell designs might be implemented in different capacity arrays and/or subarrays within a single chip or multiple chips to address system cost, power, form-factor, performance, and durability objectives. This may provide more flexibility in system design, for example.

Some USUM memory cell designs, for example, may employ an energy-efficient direct tunneling mechanism to achieve desired system performance and functionality. For example, this approach may allow voltage scalability for programming memory cells, and, consequently, power savings, that may be difficult to achieve using conventional memories and hierarchical memory designs of comparable performance and applicability.

Band-engineered USUM memory cells, for example, may employ stack design and tailored programming to establish targeted memory specifications towards achieving the system data-rate throughput (e.g., L1/L2/L3/L4 functionality) for effective execution of functions. For example, this approach may reduce data transmission delays, and thus increase data availability, at appropriate processing nodes, reduce pre-fetch data storage requirements, reduce machine cycle time for execution of functions, reduce data refresh requirements, reduce complexity in bus design, etc.

USUM-memory-cell designs may provide, for example, unique sets of functional attributes. For example, the USUM memory cell and array design may have the potential to create superior digital systems.

Figure 2:
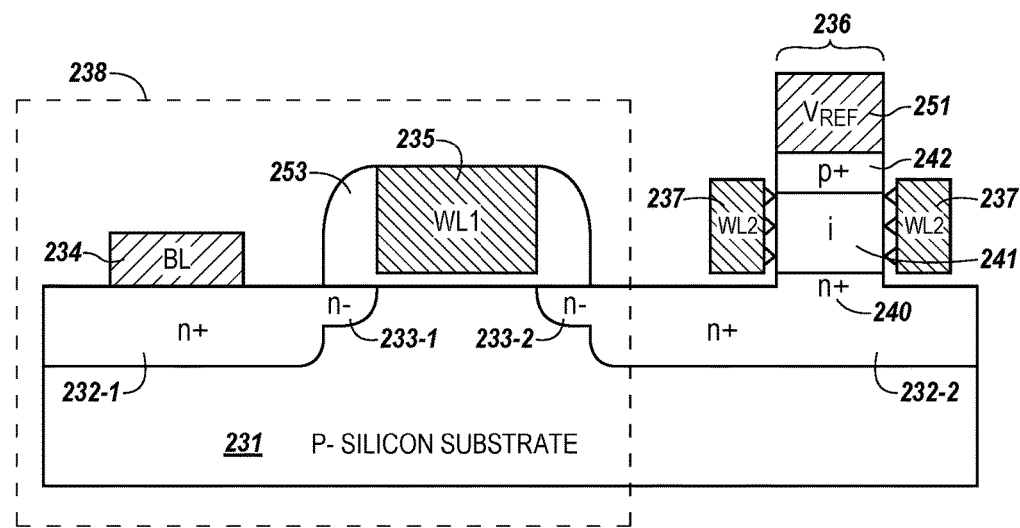
FIG. 2 illustrates an example of a non-volatile memory cell in accordance with the present disclosure.

FIG. 2 illustrates an example of a non-volatile memory cell in accordance with the present disclosure. As shown in FIG. 2, the NVM cell may include a silicon substrate 231 (e.g., a p-silicon substrate material). Doped diffusion regions 232-1, 232-2 may be created in the silicon substrate 231 for the source and drain n+ regions. If the silicon substrate 231 is a p-type material, the diffusion regions 232-1, 232-2 are n+ conductivity. However, in alternate embodiment in which the silicon substrate 231 is an n-type material, the diffusion regions 232-1, 232-2 may be heavily doped p-type diffusion regions. In some embodiments, portions 233-1, 233-2 of the diffusion regions 232-1, 232-2 may be lightly doped into n-regions to enhance FET device properties.

The example shown in FIG. 2 a schematic cross-section of an embodiment of a non-volatile memory cell isolated from adjacent similar cells (isolation not shown using conventional "Shallow-Trench-Isolation" scheme) in accordance with the present disclosure. The memory cell may be considered to be a merged version of a two-device cell consisting of a conventional high performance NFET transistor in series with a vertical gate-controlled p-i-n diode 236 at the floating n+ source 232-2 node. While this version will be illustrated in detail due to its higher performance characteristics based on higher mobility of electrons, other embodiments of memory cells could also be envisioned, for example, built on n⁻ silicon substrate with a PFET device being merged in series with a gate-controlled n-i-p diode to form an NVM cell. Due to lower mobility of holes, such options should be assumed but will not be elaborated and illustrated. Additionally, in principle, two other options may also exist for similar types of NVM cells; whereby an n-FET could be merged with an appropriate way with a gate-controlled n-i-p diode; and a p-FET could be merged in an appropriate way with a gate-controlled p-i-n diode. These will be assumed to be covered, but will not be detailed.

As shown in FIG. 2, the NVM cell may include a silicon substrate 231 (e.g., a p-silicon substrate material). Doped diffusion regions 232-1, 232-2 for n+ and 233-1, 233-2 for n− (the latter being at gate edges to improve FET device performance) may be created in the silicon substrate 231 for the source and drain regions similar to a conventional N-FET device region. The silicon substrate 231 is a p-type material in this illustration, therefore, the diffusion regions would be of n-type conductivity. With the gate 235, this forms an NFET device 238 which performs the function, similar to an "on/off" switch. The floating n+ diffusion node of the FET is integrated with the gate-controlled vertical diode 236 of p-i-n type at the conformal n+ end of the diode 236. It should be noted that both the diode 236 n+ node and the source n+ node of the FET 238 merge in this design. In some embodiments, the net effect of this merger may be a faster sensing USUM memory cell.

In the above embodiments, a data line 234 (also referred to as a bit line) may be coupled to the drain diffusion region 232-1. A first access line 235 (also referred to as word-line 1) may be coupled to both the drain region 232-1 and the "floating" source region 232-2 located on the other side of the access line 235 separated by the P⁻ substrate region 231. It should be noted that the access line 235 capacitively couples with the substrate 231 to deliver the transistor switching action of the transistor 230-1. A gate-controlled diode 236 couples to the NFET transistor through the common n+ node 232-2 raising the floating node potential higher when the diode 236 gets forward biased during the course of writing the memory cell (to the high state of "1"). The P⁺ part of the diode is directly coupled with ohmic (metallic) contact 251 and may be set at a reference potential for the operation of the diode 236. The gate 237 (word line 2) capacitively couples to the intrinsic region of the diode during write and erase operations (both "1" and "0") to ensure fast removal of injected charges during programming thereby ensuring the cycle time objective of the memory cell of FIG. 2. The p⁺i-n⁺ diode consists of a top p⁺ doped silicon layer in direct contact with ohmic contact 251 and interfacing intrinsic silicon (undoped) layer which in-turn interfacing a bottom n⁺ diffusion region 232-2 commonly shared by both the diode and the floating source node of the switching NFET 238.

In the above embodiments, memory cell activation requires both word line 1 (e.g., WL1 235) and word line 2 (e.g., WL2 237). While word line 1 is required to be activated both for reading (memory state sensing) and writing/erasing (establishing memory states), word line 2 is required to be activated only during programming (writing/erasing) of the memory states. The pulsing scheme will be discussed afterwards in FIG. 7.

Figure 3:
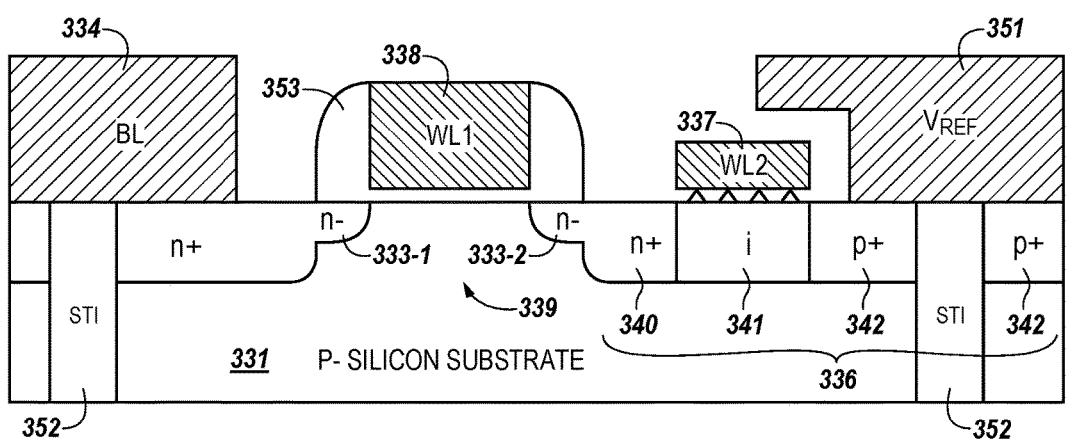
FIG. 3 illustrates another example of a non-volatile memory cell in accordance with the present disclosure.

FIG. 3 illustrates another example of a non-volatile memory cell in accordance with the present disclosure. As shown in FIG. 3, the NVM cell may include a silicon substrate 331 (e.g., a p-silicon substrate material). Doped diffusion regions 332-1, 332-2 may be created in the silicon substrate 331 for the source and drain regions. If the silicon substrate 331 is a p-type material, the diffusion regions 332-1, 332-2 are n+ conductivity. However, in alternate embodiment in which the silicon substrate 331 is an n-type material, the diffusion regions 332-1, 332-2 may be heavily doped p-type diffusion regions. In some embodiments, portions 333-1, 333-2 of the diffusion regions 332-1, 332-2 may be charged into n⁻ regions depending on a charge present in the silicon substrate 331 and/or diffusion regions 332-1, 332-2.

The illustration in FIG. 3 shows a planar implementation of the memory cell illustrated in FIG. 2. As shown in FIG. 3, the gate controlled p-i-n diode is a lateral diode sharing the common n⁺ floating node of the switching transistor. The shallow-trench-isolation 352 (STI) is a conventional oxide isolation to isolate adjacent memory cells. The bit-line 334 (or data-line) could be shared with the left adjacent memory cell in an array over the isolation region by mirror imaging each pair of memory cells. Similarly, the common reference line in ohmic contact with the p+ region of the p-i-n diode is shared with the adjacent cell on the right side by mirror-imaging that memory cell. Such sharing of the adjacent bit line and reference line reduces the effective area of each memory cell and increases memory array bit density. The memory operates in identical manner as that illustrated in FIG. 2. The planar configuration requires less processing steps and simpler processing for the p-i-n diode as well as the dielectric stack structure for the gate and several of the processing steps could be made complementary with the NFET gate stack design (e.g. the interface dielectric/blocking dielectric) compared to the gate-controlled vertical diode implementation. However, it is less dense compared to the vertical-planar configuration of the memory cell of FIG. 2.

In some embodiments, a data line 334 (e.g., a bit line) may be coupled to the source region 332. A first access line 335 may be coupled to gate 339 and/or to both the source region 332 and the drain region 333 of the silicon substrate 331. The gate 339 may be a poly-silicon control gate.

As shown in FIG. 3, a diode 336 may be coupled to the drain region 333 of the silicon substrate 331. The diode 336 may include a plurality of layers 340, 341, 342 of p-type silicon, n-type silicon, and intrinsic region(s). For example, the diode 336 may include a first material (e.g., layer) 340 coupled to the drain region 333 of the silicon substrate 331, a second material (e.g., layer) 341 coupled to the first material 340, and a third material 342 coupled to the second material 341. In some embodiments, the first material 340 may be a p-type silicon material (e.g., a p⁺-type silicon material), the second material 341 may be an intrinsic region, and the third material 342 may be an n-type silicon material (e.g., an n⁺-type silicon layer). As used herein, a "p⁺-type silicon material" and an "n⁺-type silicon material" comprise silicon that has been doped such that its resistivity is on the order of milli-ohms-centimeters. Embodiments are not so limited, however, and the diode 336 may include less than or more than three materials, and/or may include different materials at one or more layers. For example, in some embodiments, the first material 340 may be an n-type silicon material (e.g., an n⁺-type silicon layer), the second material 341 may be an intrinsic region, and the third material 342 may be a p-type silicon material (e.g., a p⁺-type silicon layer).

In some embodiments, the memory state of a memory cell may be determined by the charge stored in the second material 341 of the diode 336 altering the potential of the floating node (e.g., the potential of first material 340 or third material 342). The diode may be gate controlled, which may increase the programming performance, and/or may reduce the standby power of the memory device.

As described above, the diode 336 may be oriented parallel (e.g., horizontally) to the silicon substrate 331 or orthogonal (e.g., vertically) to the silicon substrate 331 such that a total of sixteen variations of diode 336 configuration operations are available. In some embodiments, for a planar silicon substrate 331, the diode 336 may comprise a silicon pillar that is oriented orthogonally to the silicon substrate 331. Horizontal diode 336 implementations may provide faster performance; however, such implementations may be characterized by increased process complexity and/or cell size.

In some embodiments, the diode 336 may function as a negative differential resistance device similar to those of a P-N-p-N thyristor or N-P-n-p thyristor. The memory cell may be sensed by activating a switching transistor and measuring the change in data-line potential related to the memory state associated with the floating node potential (e.g., a high state or a low state). However, in some embodiments, the switching speed may be faster than that of a DRAM due to the large difference in current level of the "on" state (e.g., the forward state) and "off" state (e.g., reverse state) of the gated diode 336.

FIG. 4 illustrates an example of a memory device in accordance with the present disclosure. The figure represents a scheme of a partial memory cell array layout consisting of two adjacent data lines in the horizontal direction, and two vertically adjacent intersecting memory cells consisting of common access lines 435 and 437 in the vertical direction defining two corresponding memory cell with reference gate nodes 436-1 and 436-2 respectively. The memory cells can be mirror-imaged separated by passive isolation, as depicted on the right side where only word-line 2 (437-N) and associated elements are shown and the word-line 1 elements for the memory cells are not shown). As shown in FIG. 4, the memory device may include first access line 435, second access line 437, and data lines 434-1, 434-N. In some embodiments, two layers of polysilicon may be used for the first access line 435 and second access line 437. The data lines 434-1, . . . , 434-N may be made of metal.

At intersections of the data lines 434-1, 434-N and the second access line 437, diodes 436-1, . . . , 436-N may be provided. As described in connection with FIG. 3, diodes 436-1, . . . , 436-N may include a plurality of layers (e.g., first material 340, second material 341, and third material 342, shown in FIG. 3). The first material may be a p-type silicon material (e.g., a p$^+$-type silicon material) or an n-type silicon material (e.g., an n$^+$-type silicon material, the second material may be an intrinsic region, and the third material may be an n-type silicon material or a p-type silicon material.

Each diode 436-1, . . . , 436-N may have a respective gate stack structure 443-1, . . . , 443-N associated therewith. Although shown as a circle encompassing each diode 436-1, . . . , 436-N, the gate stack structures 443-1, . . . , 443-N and/or the diodes 436-1, . . . , 436-N are not limited to a particular shape. For example, the diodes 336-1, . . . , 436-N and/or the gate stack structures 443-1, . . . , 443-N may be square, rectangular, trapezoidal, polygonal, or other shapes that allow for the benefits described herein to be realized. In addition, although shown as a single object in FIG. 4, the gate stack structures 443-1, . . . , 443-N may include a plurality of materials, as described in more detail in connection with FIGS. 5A and 5B, herein.

In some embodiments, the memory device illustrated in FIG. 4 may be fabricated using bulk silicon CMOS technology. An example process may include etching the diode 436 region on a starting intrinsic or very lightly doped p$^-$ silicon substrate. The first material of the diode 436 (e.g., material 340 illustrated in FIG. 3) may be implanted using an oxide cap protection on top of the silicon pillar using conventional photo-lithographic techniques. Subsequently, the first access line 435 may be formed from a polysilicon material. The second access line 437 may be formed using an anisotropic polysilicon etch.

Source and drain regions (e.g., 332-1, 332-2 illustrated in FIG. 3) may then be implanted in the memory device. After the source and drain regions are implanted, at least a portion of the memory device may be planarized to smooth the surfaces of the components of the memory device. Finally, the third material (e.g., third material 342 illustrated in FIG. 3) may be formed via selective ion implantation and conventional photo-lithography. In some embodiments, the volume dimensions of the intrinsic region (e.g., second material 341 illustrated in FIG. 3) may be controlled by an amount of thermal anneal applied following the final ion implantation process.

FIG. 5A illustrates a side view of a portion of a gate stack structure in accordance with the present disclosure. As shown in FIG. 5A, the gate stack structure 543 may include a first material 544, second material 545, and a third material 546. In some embodiments, the first material 544 may be coupled to the diode (e.g., diode 336 illustrated in FIG. 3, diodes 436-1, . . . , 436-N illustrated in FIG. 4).

In some embodiments, the first material 544 may be Lanthanum Oxide ($La_2O_3$), the second material 545 may be Gallium Nitride (GaN), and the third material 546 may be $La_2O_3$. In alternative embodiments, the first material 544 may be Hafnium Oxide ($HfO_2$), the second material 545 may be Gallium Nitride (GaN), and the third material 546 may be Hafnium Lanthanum Oxide Nitride (HfLaON). Embodiments are not limited to the specific materials described above, however, and the first material 544, the second material 545, and/or the third material 546 may be chosen such that the gate stack structure 543 has a high dielectric constant (e.g., a dielectric constant of 20 or greater), and such that the gate stack structure 543 exhibits very low leakage characteristics (e.g., such that the gate stack structure 543 has a leakage lower than 5 times that of Silicon Dioxide).

In some embodiments, the first and third material may be intrinsically trap-free dielectric films whereas the second material may be characterized to be a charge-trapping dielectric film. The gating action of the WL2, 337, is related to the charging or programming characteristics of the gate stack design. To enable the gating action and to ensure complete removal of the "On" state stored charges, the WL2 pulse voltage and pulse duration time should be appropriate to enable gate stack programming. This in turn is strongly dependent on the gate stack EOT and band-structure and thickness of the tunnel dielectric layer 544. The pulse voltage level is designed to be the power-supply voltage level. For 1.5 V power supply design, the stack EOT should be around 2.1 nm while the corresponding stack EOT for 2.5V power supply should be around 3.5 nm. The thickness range for the tunnel dielectric layer 544 for all designs range from 1.5 nm to 3.0 nm to ensure operation in Direct tunnel mode. The thickness of layers 545 and 546 are adjusted to meet the stack EOT requirements as mentioned above.

In some embodiment, programming pulse width targets may be set for functionality requirements in mind. To meet L1 functionality, for example, the pulse width could be as low as 1 ns, whereas, to meet L3 functionality, the pulse width may range from 20 ns to 100 ns, for example. The programming condition in either case ensures complete removal of stored charges from the intrinsic region. This in turn sets the specification of memory cycle time and consequently the associated memory latency or inversely the memory throughput.

In some embodiments, the materials (e.g., the first material 544, the second material 545, and the third material 546) that comprise the barrier material 543 may be chosen such that the barrier material 543 has a barrier energy against Silicon on the order of 2 electron-volts.

FIG. 5B illustrates a top view of a portion of a gate stack structure in accordance with the present disclosure. Note that the top view illustrated in FIG. 5B is from a same perspective as that illustrated in FIG. 4. As shown in FIG. 5A, the gate stack structure 543 may include a first material 544, second material 545, and a third material 546. In some embodiments, the first material 544 may be coupled to the diode 536.

As discussed in connection with FIG. 5A, the first material 544 may be Lanthanum Oxide ($La_2O_3$), the second material 545 may be Gallium Nitride (GaN), and the third material 546 may be $La_2O_3$. In such embodiments, the equivalent oxide thickness of the gate stack structure 543 may be substantially equivalent to 2.0 nanometers. In alternative embodiments, the first material 544 may be Hafnium Oxide (HfO$_2$), the second material 545 may be Gallium Nitride (GaN), and the third material 546 may be Hafnium Lanthanum Oxide Nitride (HfLaON). In such embodiments, the equivalent oxide thickness of the gate stack structure 543 may be substantially equivalent to 2.3 nanometers.

In embodiments where the first material 544 is La$_2$O$_3$, the second material 545 is GaN, and the third material 546 is La$_2$O$_3$, the thickness of the first La$_2$O$_3$ material may be around 2 nanometers, the thickness of the GaN material may be around 3 nanometers, and the thickness of the second La$_2$O$_3$ material may be around 5 nanometers. In alternative embodiments wherein the first material 544 is HfO$_2$, the second material 545 is GaN, and the third material 546 is HfLaON, the thickness of the HfO$_2$ material may be around 1.5 nanometers, the thickness of the GaN material may be around 3 nanometers, and the thickness of the HfLaON material may be around 4 nanometers.

In some embodiments, the first material 544 may function as a direct tunnel material, the second material 545 may function as a deep-offset trapping material, and the third material 546 may function as a blocking material. As used herein, a "direct tunnel material" is a dielectric material through which charges (e.g., electrons) can tunnel directly through the so-called forbidden energy barrier; a "deep-offset trapping material" is a material of material configured to store a charge; and a "blocking material" is a dielectric material configured to reduce electron injection from the gate of the diode 536 to the other materials of the gate stacked structure.

Figure 6:
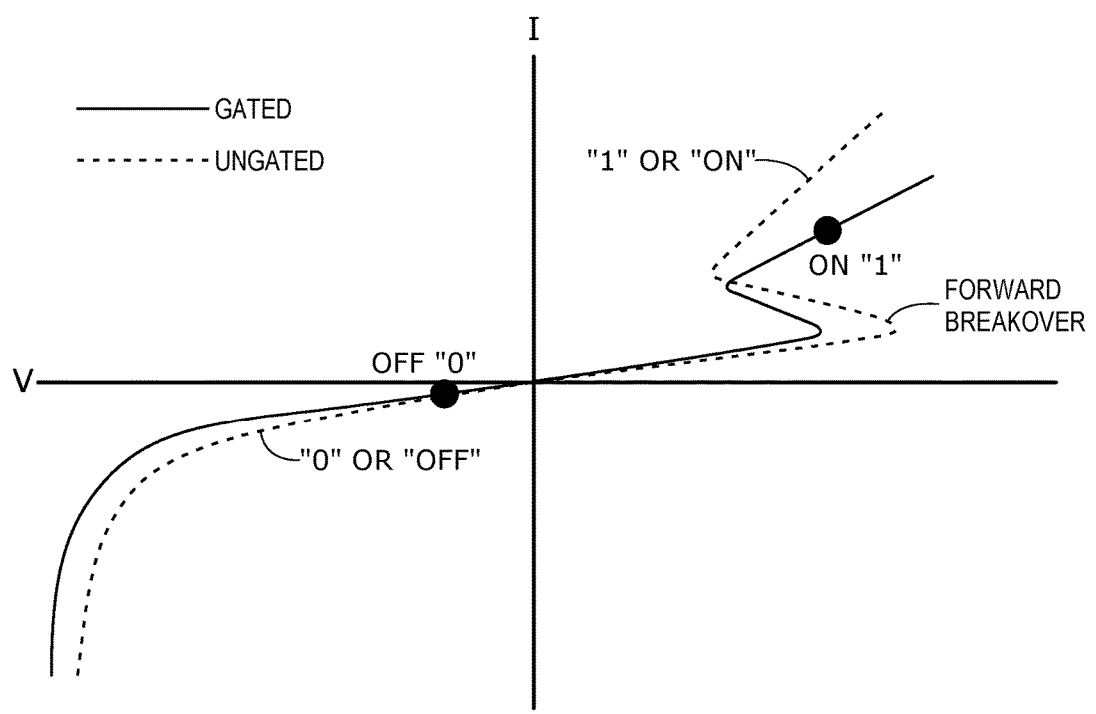
FIG. 6 illustrates an example of I-V characteristics for a gated diode versus an ungated diode in accordance with the present disclosure.

FIG. 6 illustrates an example of I-V characteristics for a gated diode versus an ungated diode in accordance with the present disclosure. The I-V characteristics shown in the example of FIG. 6 are for a diode comprising a p-type material (e.g., a p$^+$-type silicon material) coupled to an intrinsic material which is in turn coupled to an n-type material (e.g., an n$^+$-type silicon material). The I-V curve for a gated diode is shown as a solid line, while the I-V curve for an ungated diode is shown as a dotted line.

During performance of a write operation to a memory cell, the diode may be switched to a forward bias mode (e.g., an "on" state) while gate control lines limit a holding current associated with that state. When the diode is switched to reverse bias mode (e.g., an "off" state), gate enhanced switching may facilitate removal of stored charge through electron-hole recombination in order to drift off the excess stored charge. In some embodiments, this may allow for faster switching of the diode in comparison to some previous approaches. In addition, by limiting the holding current at the "on" state of the gate controlled diode, standby power may be reduced in comparison with some previous approaches. It should also be noted that utilization of a gated diode may lower the break over voltage thereby enhancing the stability of the "1" and "0" memory states.

As shown in FIG. 6, the forward breakover voltage is reduced for the gated diode as compared to an ungated diode. In some embodiments, this may allow for the "on" state of the gated diode to occur at a lower current than the ungated diode. Moreover, the transition to the "on" state may be faster in the case of the gated diode than in the case of the ungated diode.

Figure 7:
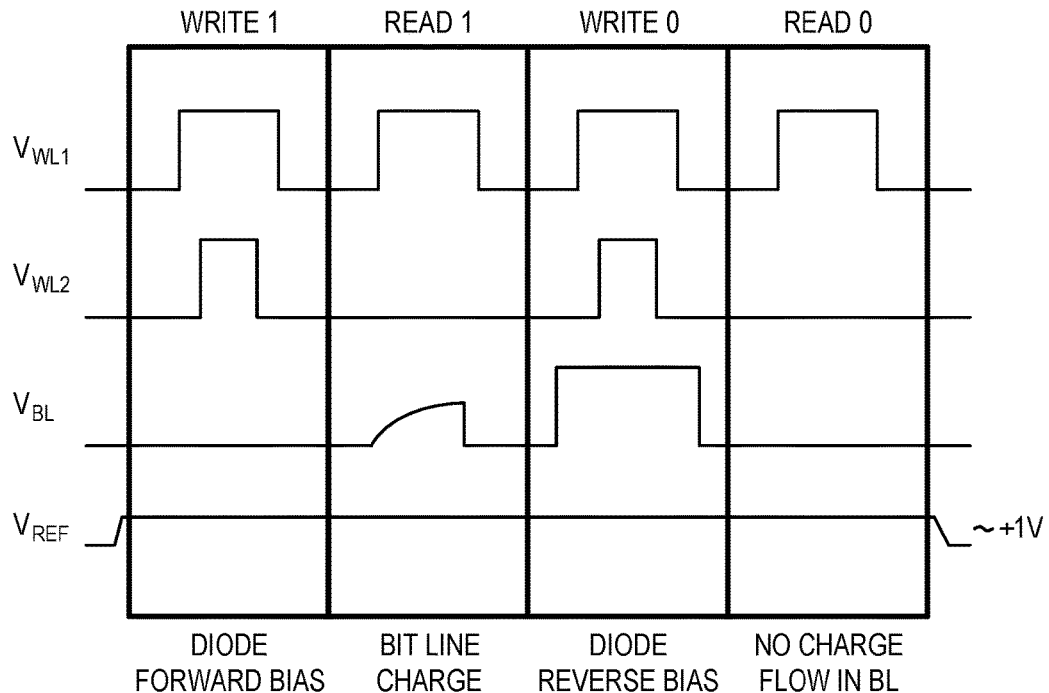
FIG. 7 illustrates an example timing diagram for a non-volatile memory in accordance with the present disclosure.

FIG. 7 illustrates an example timing diagram for a non-volatile memory in accordance with the present disclosure. More specifically, FIG. 7 illustrates a pulsing scheme of a first access line or WL1 (e.g., first access line 335 illustrated in FIG. 3), a second access line or WL2 (e.g., second access line 337 illustrated in FIG. 7), a data line or BL (e.g., data line 334 illustrated in FIG. 3), and a reference node of a diode REF (e.g., diode 336 illustrated in FIG. 3) for a gated P$^+$i-N$^+$ diode. The node potentials may be similar to the node potentials discussed below in connection with FIG. 8. For example, for a power supply voltage (V$_{DD}$) of 2.5 volts, the pulse potentials for the first access line and the data line may be 2.5 volts, while the reference potential at the diode gate may be 0.8 volts, and the second access line potential may be 1.5 volts. As illustrated in FIG. 7, the second access line may be pulsed for both write "1" and write "0" operations, while the data line may only be pulsed for a write "0" operation.

In some embodiments, during a write "1" operation, the data line is held low and the diode is forward biased. The forward biasing of the diode may be enhanced by the gating on the second access line. The second access pulse duration for a write "1" may or may not be shorter that the corresponding duration during a write "0" operation. Charges may be stored in the intrinsic region of the diode, and the n$^+$ floating node (e.g., the cathode of the diode) potential is increased.

During a write "0" operation, the data line voltage may remain high, and the diode may be reverse biased. In some embodiments, the second access line pulse may assist in switching the diode transition from on to off completely within the duration of the second access line pulse during a write "0" operation. The second access pulse duration and the voltage level must be sufficient to remove all stored charges from the intrinsic region and relates to the functionality level and cycle time for the memory cell. However, as illustrated in FIG. 7, the second access line pulse is typically shorter in duration that the first access line pulse. In some embodiments, an access transistor may be activated thereby allowing the floating data line potential to increase as charges flow out from the floating n$^+$ node to the data line.

During a read "0" operation, the n$^+$ floating node is kept at the steady state ground potential and the potential of the floating data line does not change. As shown in FIG. 7, the reference potential is nearly 1 volt, which is a higher potential than the reference potential illustrated in FIG. 7A. In some embodiments, the reference potential being nearly 1 volt may assist in forward biasing of the diode.

Figure 8:
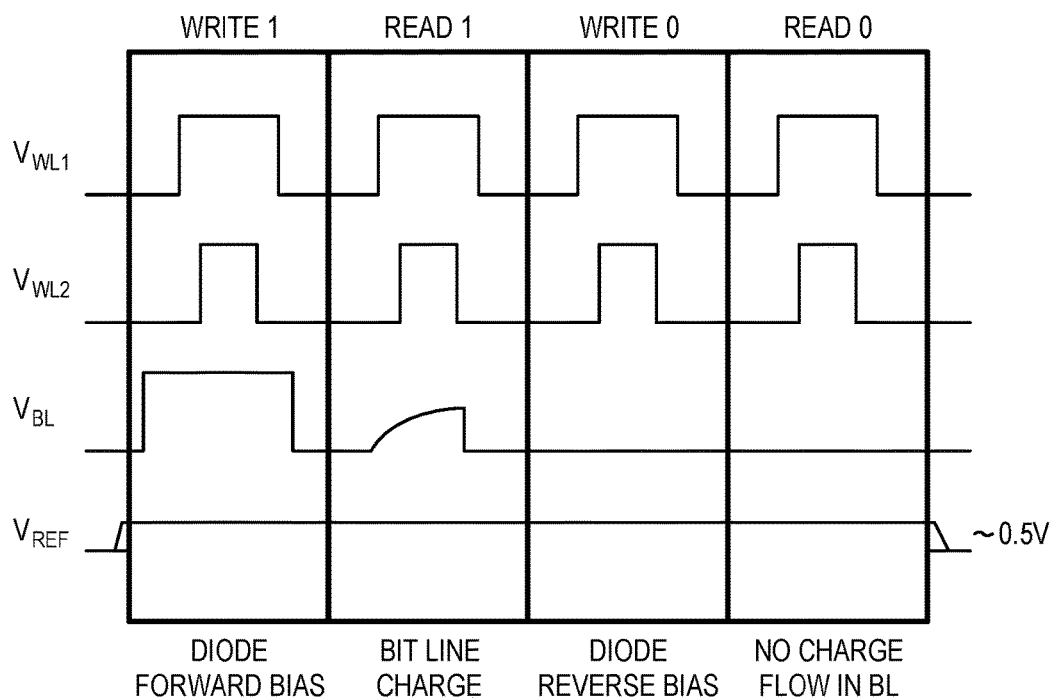
FIG. 8 illustrates another example timing diagram for a non-volatile memory in accordance with the present disclosure.

FIG. 8 illustrates another example timing diagram for a non-volatile memory in accordance with the present disclosure. More specifically, FIG. 8 illustrates a pulsing scheme of a first access line WL1 (e.g., first access line 335 illustrated in FIG. 3), a second access line WL2 (e.g., second access line 337 illustrated in FIG. 3), a data line BL (e.g., data line 334 illustrated in FIG. 3), and a reference node of a diode REF (e.g., diode 336 illustrated in FIG. 3) for a gated N$^+$i-P$^+$ diode.

In FIG. 8, V$_{WL1}$ represents a voltage driven across the first access line, V$_{WL2}$ represents a voltage driven across the second access line, V$_{BL}$ represents a voltage driven across the data line, and V$_{REF}$ represents a voltage driven across the diode reference node during operation of a memory cell. The columns illustrated in FIG. 8 correspond to a pulsing scheme utilized to write a "1," read a "1," write a "0," and read a "0."

In some embodiments, for a power supply voltage (V$_{DD}$) of 2.5 volts, the pulse potentials for the first access line and the data line may be 2.5 volts, while the reference potential at the diode gate may be 0.8 volts, and the second access line potential may be 1.5 volts. As illustrated in FIG. 8, the second access line may be pulsed for both write "1" and write "0" operations, while the data line may only be pulsed for a write "1" operation.

During a write "1" operation, the second access line may assist in the reverse breakdown of an $n^+/p^+$ junction of the diode, while the $n^+$ floating node capacitively couples to the $p^+$ cathode of the diode thereby forward biasing the diode. The second access pulse duration for a write "1" may or may not be shorter that the corresponding duration during a write "0" operation. In some embodiments, the forward biased mode (e.g., "on" state) of the diode may be further enhanced by a pulse driven across the second access line. It is noted that charges may be stored in the intrinsic region of the diode during the write "1" operation.

During a write "0" operation, the data line may be held low, and the diode may be reverse biased. In some embodiments, the second access line pulse may assist in switching the diode transition from on to off completely within the duration of the second access line pulse. The second access pulse duration and the voltage level must be sufficient to remove all stored charges from the intrinsic region and relates to the functionality level and cycle time for the memory cell. However, as illustrated in FIG. 8, the second access line pulse is typically shorter in duration that the first access line pulse.

When the data line potential is 0 volts (e.g., at the steady state potential), the floating node $n^+$ potential may assume the steady state potential of 0 volts during the write "0" operation (e.g., when the memory cell state is written to 0). In some embodiments, the state of the cell may then be read by activating an access transistor and sensing the data line potential. As a result, in some embodiments, when the cell is written with a "1," the data line potential is increased when reading the cell. When the cell is written with a "0," the data line potential remains low when the cell is read.

In some embodiments, the cell performance may depend on the turn-off speed of the diode (e.g., the speed at which the diode transitions from a write "1" to a write "0" state. This turn-off speed may be increased when using a gated diode, which may allow for enhanced removal of stored charge from the intrinsic region of the diode. In some embodiments, the stored charge volume may be lower in a diode that is oriented orthogonal to the silicon substrate than when the diode is oriented parallel to the silicon substrate, which may lead to a faster turn-off speed of the diode in the former case than in the latter. In some embodiments, the standby leakage current of the diode at the steady state (e.g., at 0 volts) may be reduced by an amount of voltage equal to the excitation voltage of the second access line.

The expression laterally of may refer to the horizontal direction (e.g., the y-direction), e.g., perpendicular to the vertical direction. A particular element being laterally between two elements may include the particular element being laterally of one of the two elements and the other of the two other elements being laterally of the particular element. A particular element being vertically between two elements may include the particular element being vertically above one of the two elements and the other of the two other elements being vertically above the particular element. Elements being vertically separated may include the elements being separated from each other in the vertical direction (e.g., the z-direction), e.g., along a vertical line or plane.

It should be recognized the term vertical accounts for variations from "exactly" vertical due to routine manufacturing, measuring, and/or assembly variations and that one of ordinary skill in the art would know what is meant by the term vertical. It should be recognized the term horizontal accounts for variations from "exactly" horizontal due to routine manufacturing, measuring, and/or assembly variations and that one of ordinary skill in the art would know what is meant by the term horizontal. It should be recognized the terms perpendicular and parallel respectively account for variations from "exactly" perpendicular and "exactly" parallel due to routine manufacturing, measuring, and/or assembly variations and that one of ordinary skill in the art would know what is meant by the terms perpendicular and parallel.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A nonvolatile memory cell, comprising:
an access device coupled to a first access line and a second access line, the first access line coupled to a substrate and the second access line coupled to a gated diode structure formed within the substrate, wherein the gated diode comprises:
a n-type silicon material coupled to an intrinsic region; and
a first p-type silicon material coupled to the intrinsic region, wherein the access device further comprises:
a shallow trench isolation (STI) region coupled to the first p-type silicon region; and
a second p-type silicon material coupled to the STI region, and
an ohmic contact coupled to the first p-type silicon material, the STI region, and the second p-type material.

2. The memory cell of claim 1, further comprising a conductive line coupled to a gate of the gated diode.

3. The memory cell of claim 1, wherein the gated diode is formed in a direction substantially orthogonal to the plurality of access lines and the plurality of data lines.

4. The memory cell of claim 1, wherein the gated diode is formed in a direction substantially parallel to the plurality of access lines and the plurality of data lines.

5. The memory cell of claim 1, wherein the gated diode is configured such that a cycle time for the memory cell is less than one nanosecond.

6. The memory cell of claim 1, wherein the gated diode is a three-terminal diode.

7. An apparatus, comprising:
a cross-point memory array comprising a plurality of data lines and access lines coupled to a substrate, wherein the data lines and access lines are substantially orthogonal to each other;
a gated diode within the substrate and disposed between a first access line and a second access line among the plurality of access lines, wherein the gated diode comprises:
a n-type silicon material coupled to an intrinsic region; and
a first p-type silicon material coupled to the intrinsic region, and wherein the cross-point memory array further comprises:
a shallow trench isolation (STI) region coupled to the first p-type silicon region;

a second p-type silicon material coupled to the STI region; and an ohmic contact coupled to the first p-type silicon material, the STI region, and the second p-type material.

8. The apparatus of claim 7, wherein at least one of the n-type silicon material, the intrinsic region material, and the first p-type silicon material have a dielectric constant greater than 20.

9. The apparatus of claim 7, further comprising a controller configured to cause a memory cell associated with the cross-point memory array to be programmed using a voltage that is substantially equal to 1.5 volts or less.

10. The apparatus of claim 7, wherein:
the n-type silicon material comprises a direct tunnel layer;
the intrinsic region comprises a deep-offset trapping layer; and
the first p-type silicon material comprises a blocking layer.

11. The apparatus of claim 7, wherein:
the n-type silicon material comprises Lanthanum Oxide or Hafnium Oxide;
the intrinsic region is Gallium Nitride; and
the first p-type silicon material comprises Lanthanum Oxide or Hafnium Lanthanum Oxide Nitride.

12. A method of forming a memory cell, comprising:
forming a semiconductor substrate having a source region and a drain region;
forming an access device on the semiconductor substrate;
forming a gated diode structure within the semiconductor substrate, wherein the gated diode structure comprises:
a n-type silicon material coupled to an intrinsic region; and
a first p-type silicon material coupled to the intrinsic region;
forming a shallow trench isolation (STI) region coupled to the first p-type silicon material;
forming a second p-type silicon material coupled to the STI region; and
forming an ohmic contact coupled to the first p-type silicon material, the STI region, and the second p-type silicon material.

13. The method of claim 12, wherein the gate stack structure is formed to have an equivalent oxide thickness substantially equal to 2 nanometers.

14. The method of claim 12, wherein the gate stack structure is formed to have an equivalent oxide thickness substantially equal to 2.3 nanometers.

15. The method of claim 12, wherein the gate stack structure is formed to have a barrier energy against silicon substantially equal to 2 electron-volts.

16. The method of claim 12, wherein the gate stack structure is formed to have a leakage rate at least five orders of magnitude lower than a leakage rate associated with silicon dioxide.

17. The method of claim 12, wherein forming the gate stack structure comprises:
forming a direct tunnel material comprising Lanthanum Oxide and having a thickness substantially equal to 2 nanometers (nm);
forming a deep-offset trapping material comprising Gallium nitride and having a thickness substantially equal to 3 nm; and
forming a blocking material comprising Lanthanum Oxide and having a thickness substantially equal to 5 nm.

18. The method of claim 12, wherein forming the gate stack structure comprises:
forming a direct tunnel material comprising Hafnium oxide and having a thickness substantially equal to 1.5 nanometers (nm);
forming a deep-offset trapping material comprising Gallium nitride and having a thickness substantially equal to 3 nm; and
forming a blocking material comprising Hafnium Lanthanum Oxide nitride and having a thickness substantially equal to 4 nm.

* * * * *